United States Patent
Ohtsuka et al.

(10) Patent No.: US 8,324,509 B2
(45) Date of Patent: Dec. 4, 2012

(54) ELECTRONIC COMPONENT AND MANUFACTURING METHOD THEREOF

(75) Inventors: Takashi Ohtsuka, Tokyo (JP); Kyung-Ku Choi, Tokyo (JP); Tatsuo Namikawa, Tokyo (JP); Hitoshi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 225 days.

(21) Appl. No.: 12/853,629

(22) Filed: Aug. 10, 2010

(65) Prior Publication Data

US 2011/0042127 A1 Feb. 24, 2011

(30) Foreign Application Priority Data

Aug. 21, 2009 (JP) ................................ 2009-192590

(51) Int. Cl.
*H05K 1/16* (2006.01)
(52) U.S. Cl. ........ 174/260; 174/250; 174/256; 174/267; 385/14; 361/761; 257/265
(58) Field of Classification Search .................. 174/250, 174/255–257, 260–261, 265
See application file for complete search history.

(56) References Cited

U.S. PATENT DOCUMENTS

| | | | |
|---|---|---|---|
| 5,629,539 A * | 5/1997 | Aoki et al. | 257/306 |
| 5,717,233 A | 2/1998 | Fujii et al. | |
| 6,509,601 B1 * | 1/2003 | Lee et al. | 257/310 |
| 6,847,071 B2 * | 1/2005 | Ueda et al. | 257/295 |
| 7,582,545 B2 * | 9/2009 | Hirai et al. | 438/500 |
| RE43,148 E * | 1/2012 | Fujisawa et al. | 349/149 |
| 2004/0211994 A1 * | 10/2004 | Ueda et al. | 257/288 |
| 2006/0192299 A1 * | 8/2006 | Hashimoto | 257/782 |
| 2007/0210362 A1 * | 9/2007 | Morita et al. | 257/295 |
| 2008/0106845 A1 * | 5/2008 | Kunimatsu et al. | 361/303 |
| 2008/0285910 A1 * | 11/2008 | Yamada et al. | 385/14 |
| 2009/0002590 A1 * | 1/2009 | Kimura | 349/43 |
| 2010/0193785 A1 * | 8/2010 | Kimura | 257/43 |

FOREIGN PATENT DOCUMENTS

| | | |
|---|---|---|
| JP | A-6-140568 | 5/1994 |
| JP | A-2005-191406 | 7/2005 |

* cited by examiner

*Primary Examiner* — Courtney Smith
(74) *Attorney, Agent, or Firm* — Oliff & Berridge, PLC (57) ABSTRACT

The invention provides an electronic component and a manufacturing method thereof that: can allow electronic components to be mounted on an external substrate at a higher density than before; can adjust the height (level) of a terminal electrode as required and desired, thereby solving problems that would occur in the inspection of the conventional electronic components; and can also improve the yield in the mounting of electronic components, thereby achieving increased productivity. A capacitor 1, which is an electronic component, has: a first upper electrode 5a formed above a substrate 2; a first seat 10 and a second seat 11 which are formed adjacent to the first upper electrode 5a; passivation layers 6 and 8 that cover the first upper electrode 5a and the first and second seats 10 and 11; and a terminal electrode 9a formed above the first and second seats 10 and 11 and connected to the first upper electrode 5a via via-conductors Va and Vc which are formed through the passivation layers 6 and 8 respectively.

4 Claims, 10 Drawing Sheets

|  | NO INCLINATION IN HEIGHT DIRECTION ||| INCLINATION IN HEIGHT DIRECTION |||
|  | Ls/nH ||| Ls/nH |||
|  | 0.1GHz | 0.5GHz | 1GHz | 0.1GHz | 0.5GHz | 1GHz |
| 1ST MEASUREMENT | 0.320 | 0.320 | 0.316 | 0.350 | 0.351 | 0.347 |
| 2ND MEASUREMENT | 0.321 | 0.321 | 0.317 | 0.350 | 0.351 | 0.347 |
| 3RD MEASUREMENT | 0.321 | 0.321 | 0.347 | 0.350 | 0.352 | 0.347 |
| AVERAGE | 0.321 | 0.321 | 0.317 | 0.350 | 0.351 | 0.347 |
| STANDARD DEVIATION | 0.001 | 0.001 | 0.001 | 0.000 | 0.001 | 0.000 |

FIG.16

ELECTRONIC COMPONENT AND MANUFACTURING METHOD THEREOF

CROSS-REFERENCES TO RELATED APPLICATIONS

The present application relates to and claims priority from Japanese Patent Application No. 2009-192590, filed on Aug. 21, 2009, the entire disclosure of which is incorporated herein by reference.

BACKGROUND

1. Field of the Invention

The present invention relates to an electronic component and a manufacturing method thereof.

2. Description of Related Art

In recent years, together with the reduction in size of electronic devices, an increasing number of electronic device modules have been developed in which electronic components, including active components such as semiconductor devices, e.g., an IC chip (bare chip, die), for use in the electronic devices, and passive components such as a capacitor (condenser), inductor, thermistor and resistance, are mounted at considerably higher density than before.

Electronic components mounted in such modules have various terminal electrode configurations, and known examples include the configuration of a chip resistor shown in Patent Document 1, where an external electrode is disposed to be connected to an element electrode of the electronic component and the external electrode is formed by multilayer plating so that it covers the edge portion of the top and bottom surfaces as well as the side wall of the electronic component itself. Another known example is the configuration of a semiconductor device shown in Patent Document 2, where terminal electrodes in the form of wiring layers are disposed at a position above a semiconductor element or an integrated circuit formed on a substrate, and at a position outside (outward) the semiconductor element or integrated circuit.

Patent document 1: Japanese Unexamined Patent Publication No. 2005-191406

Patent document 2: Japanese Unexamined Patent Publication No. 06-140568

SUMMARY

When mounting an electronic component having a conventional terminal electrode configuration as shown in Patent Document 1 onto an external substrate such as a wiring board by soldering (reflow soldering), the resulting solder fillet is likely to be in a flared shape, extending outward from the external electrode of the electronic component, which has been formed by plating to cover a large area including the edge portion of the top and bottom surfaces as well as the side wall of the electronic component, and occupying a considerably larger area than the area that the element itself of the electronic component occupies. Accordingly, the area that is actually needed to mount the electronic component onto the external substrate (actual mounting area) would be unduly large relative to the form of the element of the electronic component, and disposing multiple electronic components more densely with narrower spaces would be difficult, resulting in limitations to the much higher density mounting which is demanded for electronic components.

Also, in an electronic component having a conventional terminal electrode configuration as shown in Patent Document 2, two terminal electrodes (metal wirings) are formed with different heights (on different levels relative to the substrate), and this causes problems in the inspection of the component; for example, contact failure would occur between the terminal electrodes and inspection pins (inspection probes), resulting in the inspection being difficult, and in some cases, the inspection pins would be damaged.

In view of the above, an object of the invention is to provide an electronic component and a manufacturing method thereof that: can allow electronic components to be mounted on an external substrate at a higher density than before; can adjust the height (level) of a terminal electrode as required and desired, thereby solving problems that would occur in the inspection of the conventional electronic components; and can also improve the yield in the mounting of electronic components, thereby achieving increased productivity.

In order to solve the above-described problems, the invention provides an electronic component having: an electronic circuit element formed on a substrate and having an element electrode; a seat portion formed adjacent to the electronic circuit element; a passivation layer (insulating layer) that covers the electronic circuit element and the seat (pedestal) portion; and a first terminal electrode wired (extended) out from the element electrode onto the passivation layer, wherein the first terminal electrode is formed to extend above the seat portion In the electronic component having the above configuration, the seat portion is disposed adjacent to the electronic circuit element having the element electrode, and the first terminal electrode is formed above that seat portion. Accordingly, by arbitrarily adjusting the thickness of the seat portion, the position (height, level) of the terminal electrode can be adjusted as required. As a result, for example, if another terminal electrode is formed and connected to the electronic circuit element, in addition to the first terminal electrode formed above the seat portion, the two electrodes can be accurately adjusted in a simple way so as to be on the same level relative to the substrate, in other words, in the same layer. Thus, when the two terminal electrodes are brought into contact with inspection probes (inspection pins) for the inspection of the electronic component, contact failure between them can be prevented and the inspection can be suitably performed. In addition, the damage of the inspection pins or other problems can be reduced.

Also, since the first terminal electrode is disposed above the seat portion and the seat portion is adjacent to the electronic circuit element having the element electrode, in other words, the first terminal electrode is not formed directly above (the effective area of) the electronic circuit element, when heat treatment is performed for the formation of the conductor structure of the first terminal electrode, the heat (stress) arising from that treatment does not directly transfer to the electronic circuit element, and a thermal influence to the electronic circuit element can be removed or reduced. Also, when pressing inspection probes (inspection pins) on the first terminal electrode for the inspection of the electronic component as described above, the mechanical pressing force can be prevented from being applied to the electronic circuit element. Accordingly, the electronic circuit element can be protected from thermal and mechanical stress, and thus, the reliability of the electronic component can be increased.

Also, when soldering the electronic component on an external substrate, the area where the solder bonded to the first terminal electrode extends and/or the amount of the solder used can be reduced compared to the case where the terminal electrode is configured as a conventional side-face terminal formed by plating. Accordingly, it is possible to dispose multiple electronic components more densely with narrower spaces, and contribute to high-density mounting by the reduction of the actual mounting area of each electronic component.

Also, the manufacturing process can be simplified compared to the case of forming a conventional side-face terminal by plating. Furthermore, since such a side-face terminal configuration, which is typically represented by a conventional chip capacitor, is not employed, unnecessary floating inductance or floating capacitance can be prevented/reduced in the circuit including the electronic component. In addition, although the conventional method that applies plating to the edge portion of the electronic component needs to process individual electronic components piece by piece (component by component), the electronic component according to the invention can be formed by a process of forming a plurality of element structures for the electronic components on a single substrate, forming terminal electrodes for each component, and thereafter dividing the substrate into each component by dicing, etc., and accordingly, the invention is also advantageous in that the electronic component itself can be manufactured with significantly improved productivity.

In the above configuration, it is preferable that the element electrode includes a lower electrode formed on a side close to the substrate and an upper electrode formed above the lower electrode, and that the seat portion has at least a first seat and a second seat which are built up such that the first seat is in the same layer as the lower electrode and the second seat is in the same layer as the upper electrode.

With this configuration, the lower electrode and the first seat can be formed simultaneously (in the same step) and the upper electrode and the second seat can be formed simultaneously (in the same step). Since it is not necessary to form the element electrodes and the seat portion separately in different steps, the manufacturing process can be simplified, resulting in even further improved productivity.

It is also preferable that the seat portion is formed of metal. The metal seat portion can increase the strength of the electronic component compared to a non-metal seat portion formed of resin, etc., and thus is suitable.

More specifically, in one suitable example of the above, a direct metal-to-metal contact is created between the seat portion and the first terminal electrode, and no medium (layer) lies between them. If so, a metal column extending from the seat portion to the first terminal electrode is formed, and the direct metal-to-metal contact results in relatively strong bonding between the seat portion and the first terminal electrode, as described above. Also, even if the seat portion and the first terminal electrode are indirectly bonded via other metal (layers), a metal-to-metal contact is created in the interfaces between the respective layers and this results in relatively strong bonding between the layers, and accordingly, the adhesion strength in the electronic component can be improved.

It is also preferable that: the electronic component of the invention has a second terminal electrode connected to the lower electrode of the electronic circuit element; the first terminal electrode and the second terminal electrode are disposed on opposite sides of the electronic circuit element; and the first terminal electrode is connected to the upper electrode of the electronic circuit element via an extension electrode. With this configuration, it is possible to ensure that the first and second terminal electrodes, which are connected respectively to the upper electrode and the lower electrode of the electronic circuit element, are disposed on opposite sides of (the effective area of) the electronic circuit element with sufficient space between them. Accordingly, when solder-mounting the electronic component on an external substrate, the invention is advantageous in that it is easy to insulate the respective solder portions bonded to the first and second terminal electrodes from one another.

The invention also provides a method for effectively manufacturing the electronic component of the invention, the method including the steps of: forming an electronic circuit element on a substrate, the electronic circuit element having an element electrode; forming a seat portion adjacent to the electronic circuit element; forming a passivation layer that covers the electronic circuit element and the seat portion; and forming a first terminal electrode above the seat portion such that the first terminal electrode is connected to the element electrode.

DETAILED DESCRIPTION OF PREFERRED EMBODIMENTS

Embodiments of the invention will be described below with reference to the attached drawings. In the drawings, the same components are given the same reference numerals, and any repetitive description will be omitted. The positional relationship, such as top and bottom, left and right, etc., is as shown in the drawings unless otherwise specified. The dimensional ratios are not limited to those shown in the drawings. The below embodiments are just examples for describing the invention, and the invention is not limited to those embodiments. The invention can be modified in various ways without departing from the gist of the invention.

First Embodiment

Figure 1:
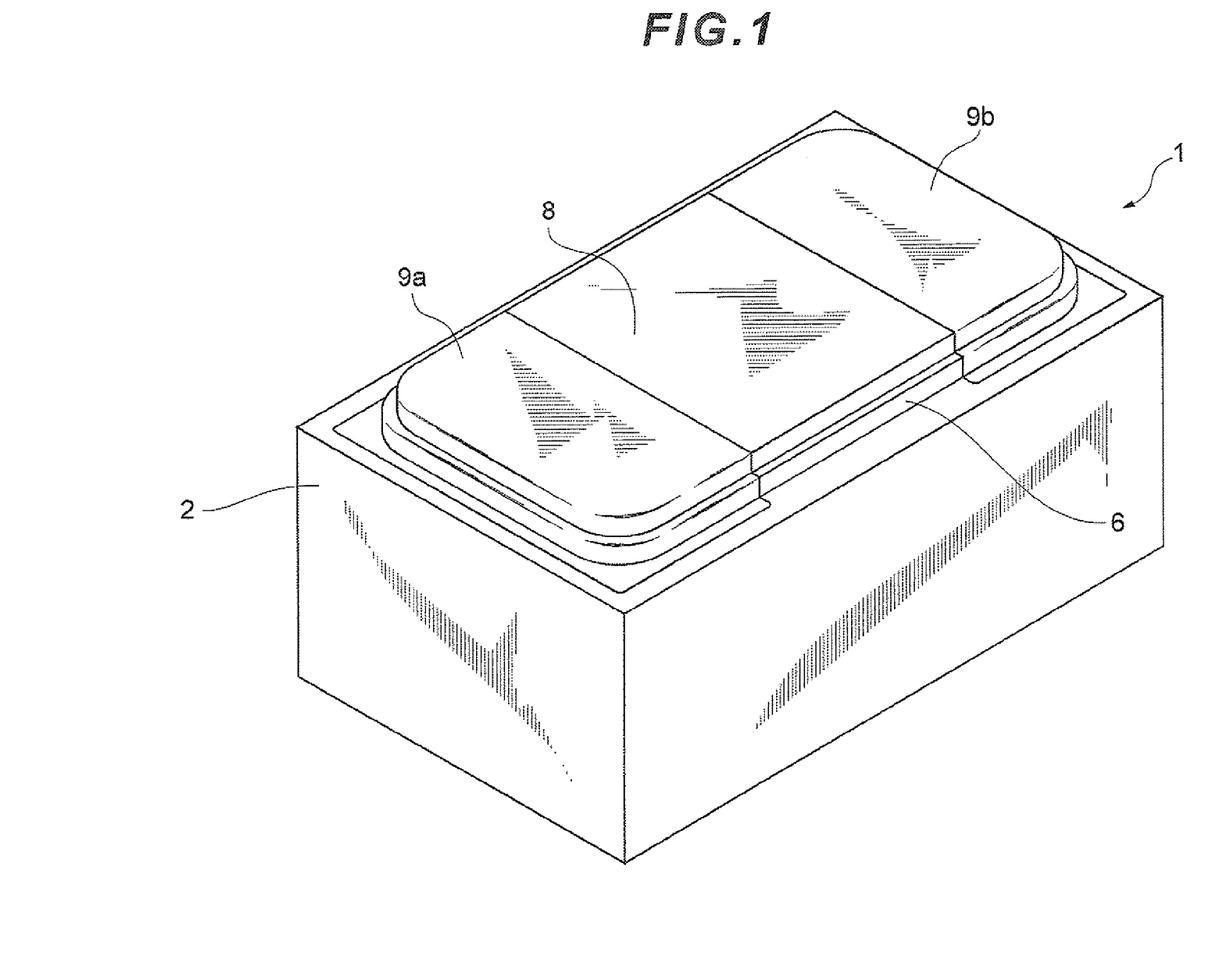
FIG. 1 is a perspective view illustrating the configuration of a capacitor, which is a preferred embodiment (first embodiment) of the electronic component according to the invention.
Figure 2:
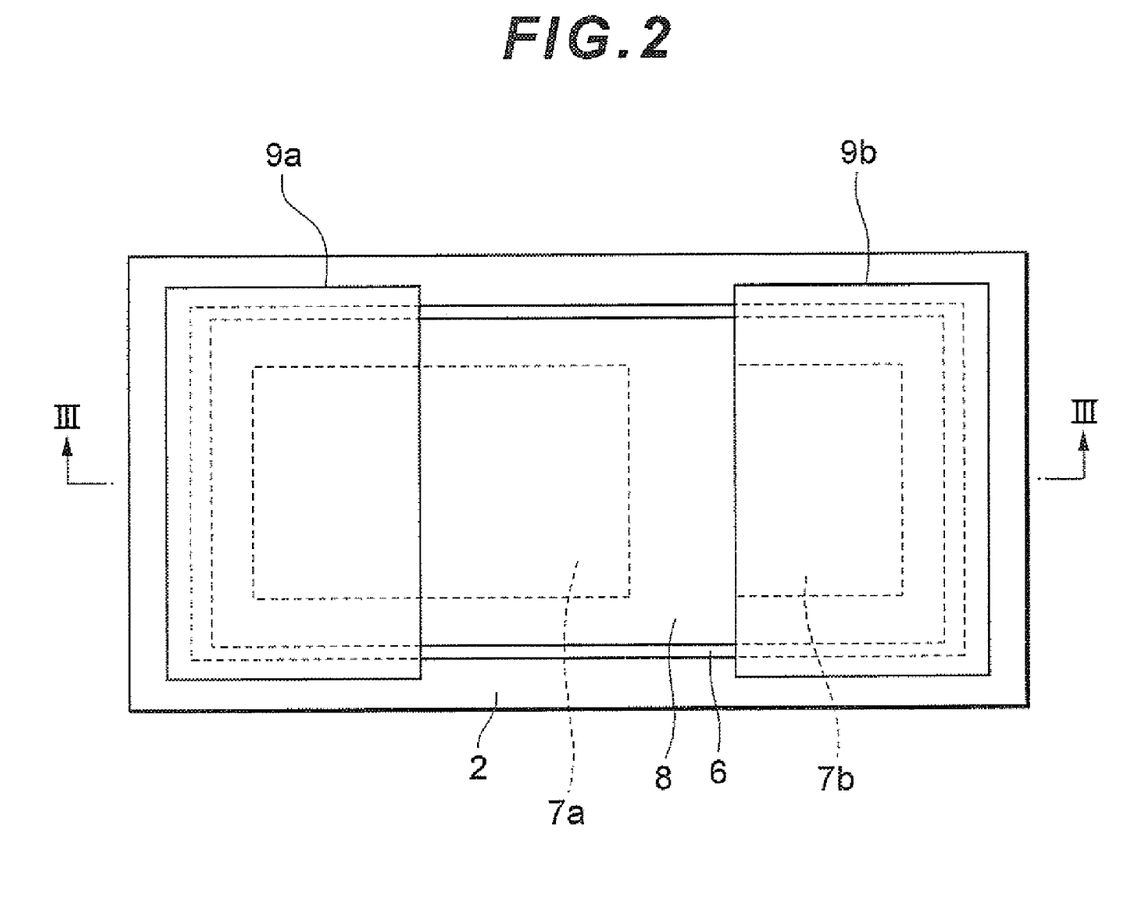
FIG. 2 is a plan view of the capacitor 1 shown in FIG. 1.
Figure 3:
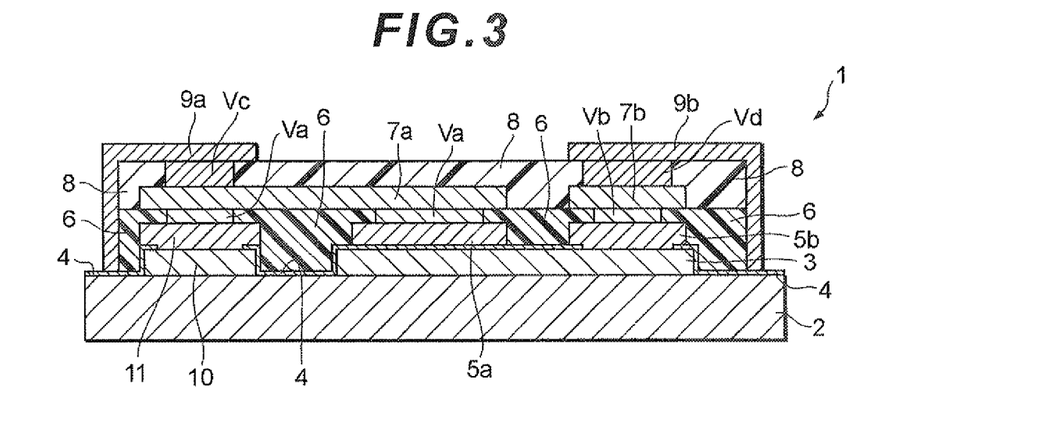
FIG. 3 is a cross-sectional view along the line III-III in FIG. 2.

FIG. 1 is a perspective view illustrating the configuration of a capacitor 1, which is a preferred embodiment of the electronic component according to the invention, FIG. 2 is a plan view of the capacitor 1 shown in FIG. 1, and FIG. 3 is a cross-sectional view along the line III-III in FIG. 2.

The capacitor 1 (condenser, electronic component) is formed by building up, on a substrate 2 having a rectangular shape in a plan view, the following components: a lower electrode 3; a dielectric layer 4; a first upper electrode 5a; a second upper electrode 5b; a first passivation layer 6 (passivation layer); extension electrodes 7a and 7b; a second passivation layer 8 (passivation layer); a pad electrode 9a (first terminal electrode); and a pad electrode 9b (second terminal electrode), in this order. The capacitor 1 also has a first seat 10 (pedestal) formed in the same layer as the lower electrode 3, and a second seat 11 (pedestal) formed directly on the first seat 10 and in the same layer as the first and second upper electrodes 5a and 5b. In this configuration, the lower electrode 3 and the first upper electrode 5a constitute an element electrode, the pad electrodes 9a and 9b serve as terminal electrodes, and the first and second seats 10 and 11 constitute a seat portion. Also, the lower electrode 3, the first upper electrode 5a, and the dielectric layer 4 disposed between them define the effective (element) area of an electronic circuit element.

There are no particular limitations on the material of the substrate 2, and the substrate 2 may be a metal substrate, a ceramics substrate formed of alumina, etc., a glass ceramics substrate, a glass substrate, a monocrystal substrate formed of sapphire, MgO, SrTiO, etc., or a semiconductor substrate formed of Si, SiGe, etc. Substrates that are chemically and thermally stable, cause less stress and easily keep the substrate surface smooth are used preferably. The thickness of the substrate 2 may arbitrarily be determined as required.

The lower electrode 3 is disposed on the substrate 2 in an area inside the periphery of the substrate 2, and formed of, for example, a single metal such as Ni, Ti, Cu, Au, Pt, Ag, Sn, Cr, Co, W, Pd, Mo, Ta, Ru, or Nb, or a complex metal such as an alloy containing the above metals.

The first seat 10 is disposed in the same layer as the lower electrode 3, and as with the lower electrode 3, the first seat 10 is formed of, for example, a single metal such as Ni, Ti, Cu, Au, Pt, Ag, Sn, Cr, Co, W, Pd, Mo, Ta, Ru, or Nb, or a complex metal such as an alloy containing the above metals.

The dielectric layer 4 is a thin film layer formed to cover the top surface and the side wall of the lower electrode 3, as well as a part of the top surface of the substrate 2 outside the lower electrode 3. The edge (end) portion of the dielectric layer 4 may or may not reach the edge (end) portion on the top surface of the substrate 2. There are no particular limitations on the film material for the dielectric layer 4, and examples include high dielectric ceramic materials, such as $PbTiO_3$, $Pb(Zr, Ti)O_3$(PZT), $PbNb_2O_6$, $Pb(Mg, Nb)O_3$(PMN), $BaTiO_3$, $(Ba, Sr)TiO_3$(BST), $CaTiO_3$, $ZrO_2$, $HfO_2$, $TiO_2$, $Ta_2O_6$, $Bi_4Ti_4O_{12}$, $SrBi_2Ta_2O_9$, $Al_2O_3$, $Si_3N_4$ or $SiO_2$.

The first upper electrode 5a and the second upper electrode 5b are thin film electrodes formed on the dielectric layer 4. The first upper electrode 5a is formed above the lower electrode 3 via the dielectric layer 4 and constitutes the capacitor. The second upper electrode 5b is formed such that it covers the top surface of the lower electrode 3 at the center thereof while covering the top surface of the lower electrode 3 via the dielectric layer 4 at the edge portion. In other words, the dielectric layer 4 formed on the lower electrode 3 has an opening, and via this opening, the lower electrode 3 is electrically connected to the second upper electrode 5b. The center portion of the second upper electrode 5b is directly connected to the lower electrode 3, creating a configuration where electric current flows between the lower electrode 3 and the center portion of the second upper electrode 5b. As with the lower electrode 3, the first and second upper electrodes 5a and 5b are formed of, for example, a single metal such as Ni, Cu, Au, Pt, Ag, Sn, Cr, Co, W, Pd, Mo, Ta, Ru, or Nb, or a complex metal such as an alloy containing the above metals.

The second seat 11 is formed directly on the first seat 10 and in the same layer as the first and second upper electrodes 5a and 5b. More specifically, the second seat 11 and the second upper electrode 5b are located on opposite sides of the first upper electrode 5a, the first upper electrode 5a defining the effective area of the capacitor 1. As with the lower electrode 3 and the first and second upper electrodes 5a and 5b, the second seat 11 is formed of, for example, a single metal such as Ni, Ti, Cu, Au, Pt, Ag, Sn, Cr, Co, W, Pd, Mo, Ta, Ru, or Nb, or a complex metal such as an alloy containing the above metals.

The first passivation layer 6 formed on the first and second upper electrodes 5a and 5b and the second seat 11 is configured such that it covers not only the respective corners of the first upper electrode 5a, the second upper electrode 5b and the second seat 11, but also the dielectric layer 4, more specifically, the top surface of the corners and the side wall of the dielectric layer 4 at the portion under the first and second upper electrodes 5a and 5b, and the side wall of the dielectric layer 4 at the portion under the second seat 11. The material of the first passivation layer 6 is not particularly limited, and examples of the material include inorganic insulating materials such as $Al_2O_3$, $SiO_2$, or SiN, and organic insulating materials such as resins including polyimide and epoxy.

The extension electrodes 7a and 7b are formed on the first passivation layer 6 and cover the first upper electrode 5a, the second upper electrode 5b and the first seat 10. More specifically, the (first) extension electrode 7a is extended from the first upper electrode 5a toward the first seat 10, the first seat 10 and the second upper electrode 5b being on opposite sides of the first upper electrode 5a, so that the first extension electrode 7a connects the first upper electrode 5a and the first and second seats 10 and 11; while the (second) extension electrode 7b is formed above the second upper electrode 5b. Obviously, it is not necessary to electrically connect the first seat 10, the second seat 11 and the first extension electrode 7a with one another; however, the adhesion strength in the electronic component can be even further improved by creating a metal-to-metal contact between them. As can be also clearly seen from the capacitor manufacturing process explained later, the above configuration is particularly suitable because: the adjacent lower electrode 3 and first seat 10 are simultaneously formed to be in the same layer; the first upper electrode 5a and the second seat 11 are simultaneously formed to be in the same layer; the first extension electrode 7a is formed on the top surface of the first passivation layer 6 which fills the space between the first upper electrode 5a and the second seat 11 as well as their peripheral areas; and accordingly, the pad electrodes 9a and 9b can easily be located in the same layer. As with the lower electrode 3 and the first and second upper electrodes 5a and 5b, the extension electrodes 7a and 7b are formed of, for example, a single metal such as Ni, Cu, Au, Pt, Ag, Sn, Cr, Co, W, Pd, Mo, Ta, Ru, or Nb, or a complex metal such as an alloy containing the above metals.

The second passivation layer 8 is formed as the upper layer of the extension electrodes 7a and 7b, so that it covers the exposed top surface of the first extension electrode 7a and the corners of the extension electrodes 7a and 7b. As with the first passivation layer 6, the material of the first passivation layer 8 is not particularly limited, and examples of the material include inorganic materials such as $Al_2O_3$, $SiO_2$, or SiN, and insulating materials such as resins including polyimide and epoxy.

The pad electrodes 9a and 9b are formed as the upper layer of the second passivation layer 8, and disposed at both ends of the substrate 2, as the uppermost layer of the substrate 2. The pad electrode 9a is configured to be connected to the first extension electrode 7a which is extended (projected) out from the first upper electrode 5a toward the second seat 11, while the pad electrode 9b is configured to be connected to the second extension electrode 7b. More specifically, the pad electrode 9a is connected to the first upper electrode 5a via a via-conductor Vc formed through the second passivation layer 8, the first extension electrode 7a and a via-conductor Va formed through the first passivation layer 6, while the pad electrode 9b is connected to the lower electrode 3 via a via-conductor Vd formed through the second passivation layer 8, the second extension electrode 7b, a via-conductor Vb formed through the first passivation layer 6 and the second upper electrode 5b. Also, the conductor layers 9a and 9b used as the pad electrodes are not only formed on the top surface of the second passivation layer 8 but also extend along the side walls of the first passivation layer 6 and the second passivation layer 8 so that the edge portion of the conductor layers 9a and 9b used as the pad electrodes reaches the substrate-side end of the first passivation layer 6 side wall, and the edge portion is in contact with the dielectric layer 4 formed on the substrate 2. Furthermore, in this embodiment, the conductor layers 9a and 9b are formed inside the edge portion of the substrate on the side close to the electronic circuit element. With this configuration, problems that may occur during inspection can be solved, and the improvement of strength in soldering and the reduction of the actual extending area of a solder fillet can be achieved at the same time. As with the lower electrode 3, the first and second upper electrodes 5a and 5b and the extension electrodes 7a and 7b, the material of the via-conductors Va-Vd and the pad electrodes 9a and 9b is not particularly limited, and examples of the material include a single metal such as Ni, Cu, Au, Pt, Ag, Sn, Cr, Co, W, Pd, Mo, Ta, Ru, or Nb, and a complex metal such as an alloy containing the above metals.

Next, one example of the method for manufacturing a capacitor 1 of the above configuration will be described below. FIGS. 4-10 are process charts showing the steps for manufacturing the capacitor 1.

First, a substrate 2 is prepared, and the surface is planarized by polishing, for example, CMP. Actually, a plurality of element electrode structures for capacitors 1 (for example, a fine structure of line/space=several μm/several μm), is formed on a single substrate 2, and lastly, the substrate is cut element by element into individual pieces (individual components) to obtain a plurality of capacitors 1, but the drawings referred to in the below description show the portion corresponding to the element electrode structure for one capacitor 1.

Formation of Lower Electrode

Figure 4A:
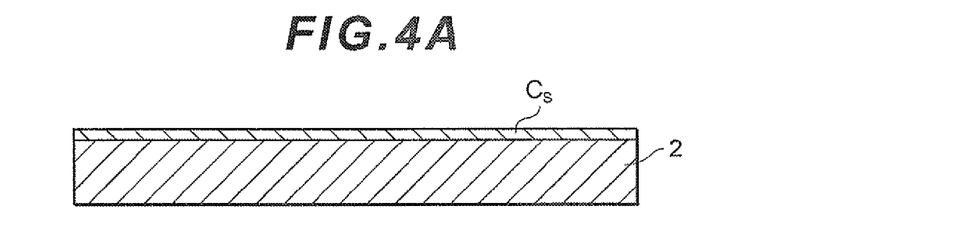
FIGS. 4A-4C are process charts showing the steps for manufacturing a capacitor 1.
Figure 4B:
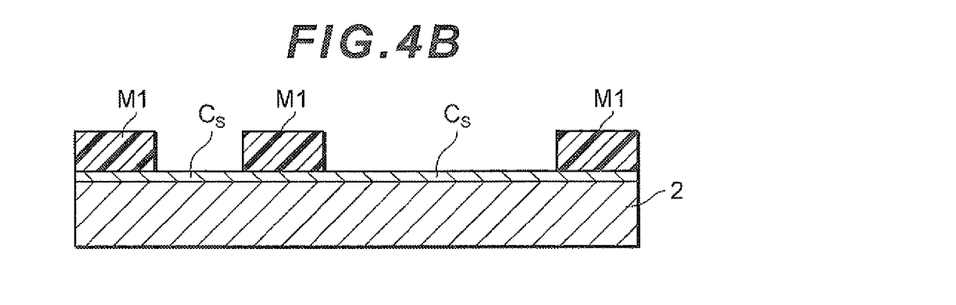

A lower electrode 3 and a first seat 10 are formed on the above substrate 2 by photolithography and plating. More specifically, for example, a base conductor layer Cs having a film thickness of around 0.01-1 μm is first formed on the exposed surface of the substrate 2 as a seed layer by sputtering or non-electrolytic plating (FIG. 4A). Next, a photoresist film is deposited on the base conductor layer Cs, and processed by photolithography to form a resist mask M1 at the portions not corresponding to the lower electrode 3 or the first seat 10 (portions where the lower electrode 3 and the first seat 10 are not to be formed) (FIG. 4B).

Figure 4C:
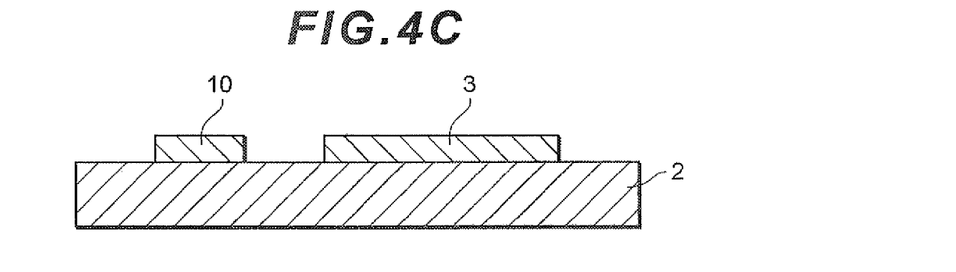

After that, using the formed resist mask M1 as a plating mask, the exposed portion of the base conductor layer Cs is selectively electroplated (electrolytically plated) so that an electroplate conductor layer for the formation of the lower electrode has been electrodeposited with a desired thickness. By removing the resist mask M1 and the seed layer outside the electroplate conductor layer (the seed layer on which the electroplate conductor layer has not been formed), a conductor layer 3 used as the lower electrode and a conductor layer 10 used as the first seat are obtained (FIG. 4C). In FIG. 4C, these conductor layers 3 and 10 are given the same reference numerals as the lower electrode 3 and the first seat 10.

Formation of Dielectric Layer

Figure 5A:
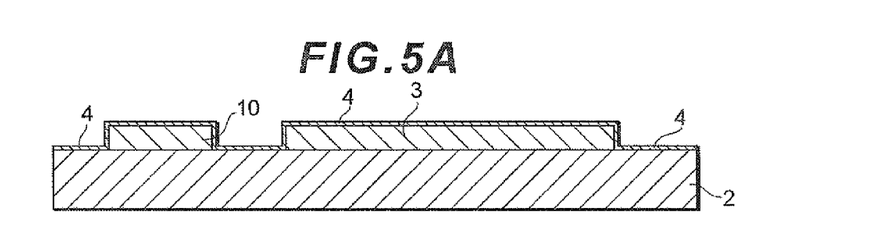
FIGS. 5A-5C are process charts showing the steps for manufacturing a capacitor 1.
Figure 5B:
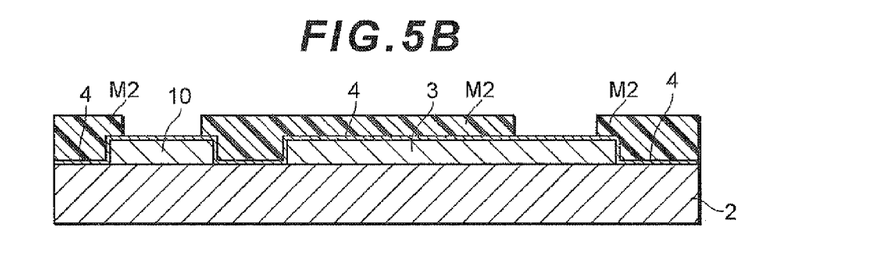
Figure 5C:
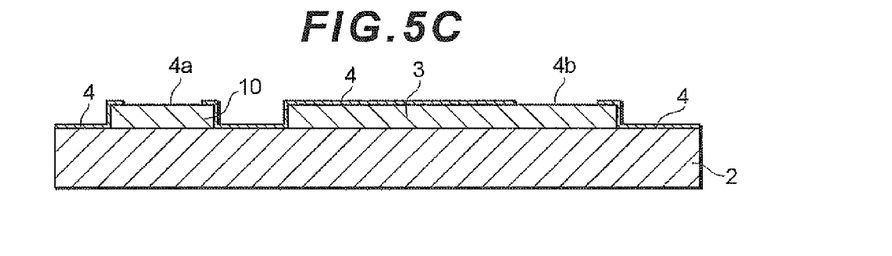

Next, a dielectric layer 4 is formed so that it covers the top surface, the edge portion of the top surface, and the side wall of the lower electrode 3, the edge portion of the top surface and the side wall of the first seat 10, and a part of the top surface of the substrate 2 outside the lower electrode 3 and the first seat 10. More specifically, the dielectric layer 4 is first formed on the entire surface of the lower electrode 3, the first seat 10 and the exposed portion of the substrate 2 by PVD such as sputtering, CVD, ALD, or a solution method, etc., to have a thickness of around 0.01-1 μm (FIG. 5A). After that, a resist mask M2 made of a photoresist is formed on the resulting dielectric layer 4 at the portions where the pad electrodes 9a and 9b are not going to be formed (FIG. 5B). By using this resist mask M2 as an etch mask, a part of the dielectric layer 4 is removed by etching to form openings 4a and 4b, thereby obtaining the dielectric layer 4 having the openings 4a and 4b (FIG. 5C).

Formation of First and Second Upper Electrodes

Figure 6A:
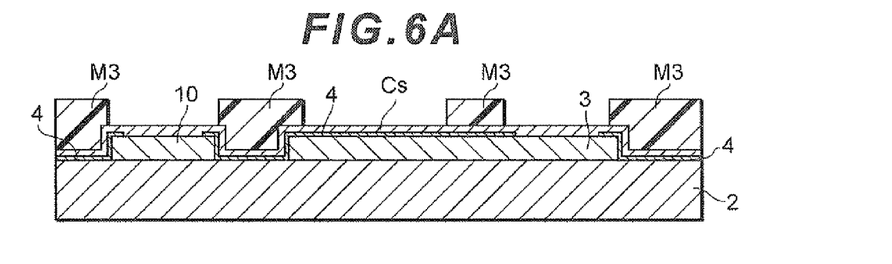
FIGS. 6A-6B are process charts showing the steps for manufacturing a capacitor 1.
Figure 6B:
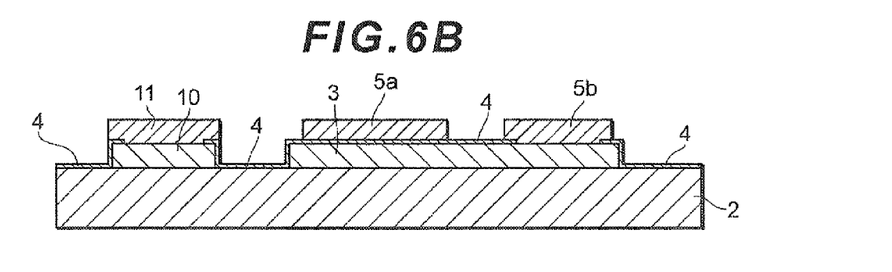

Next, conductor layers 5a and 5b used as first and second upper electrodes and a conductor layer 11 used as a second seat are formed on the top surface of the dielectric layer 4 as well as the exposed portions of the lower electrode 3 and the first seat 10 shown in FIG. 6, by plating or CVD, etc. The conductor layers 5a and 5b for the first and second upper electrodes are formed inside (not to extend beyond) the mounting area of the conductor layer 3 for the lower electrode. More specifically, for example, a base conductor layer Cs having a film thickness of around 0.01-1 μm is first formed on the dielectric layer 4 as a seed layer by sputtering or non-electrolytic plating. After that, a resist mask M3 is arranged on the base conductor layer Cs (FIG. 6A). Subsequently, the exposed portion of the base conductor layer Cs, in other words, the base conductor layer Cs formed on the lower electrode 3 and the first seat 10 and not covered with the resist mask M3, is selectively electroplated (electrolytically plated) so that an electroplate conductor layer for the formation of the first and second upper electrodes has been electrodeposited with a desired thickness. After that, by removing the resist mask M3 and the seed layer outside the electroplate conductor layer, the conductor layers 5a, 5b and 11 used as the first upper electrode, second upper electrode and second seat respectively are obtained (FIG. 6B). In FIG. 6B, these conductor layers 5a, 5b and 11 are given the same reference numerals as the first upper electrode 5a, the second upper electrode 5b and the second seat 11.

Formation of First Passivation Layer

Figure 7A:
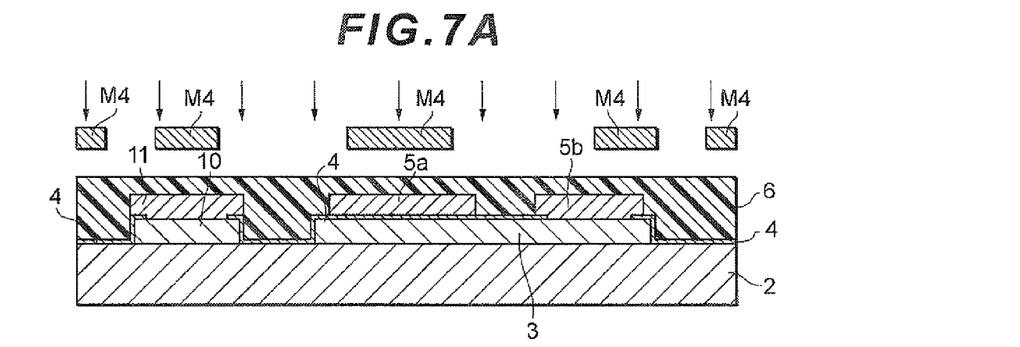
FIGS. 7A-7B are process charts showing the steps for manufacturing a capacitor 1.
Figure 7B:
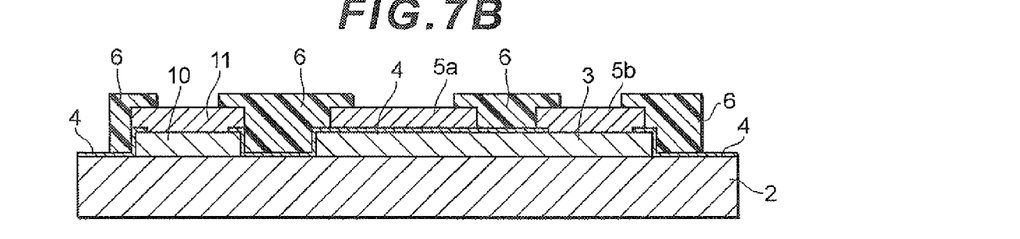

Next, in order to form a first passivation layer 6 so that it covers the top surface and side wall of the first and second upper electrodes 5a and 5b, the top surface and side wall of the second seat 11, the top surface of the dielectric layer 4 formed on the lower electrode 3, the dielectric layer 4 formed on the side wall of the lower electrode 3, and the dielectric layer 4 formed on the substrate 2, for example, an uncured photo-curable resin is applied (FIG. 7A). After that, a metal mask M4 is placed over the portion where the first passivation layer 6 is not to be formed, and in this state, patterning is carried out by photolithography, thereby forming the first passivation layer 6 that covers the edge portion of the first and second upper electrodes 5a and 5b, the edge portion of the second seat 11, the top surface of the dielectric layer 4 formed on the lower electrode 3, the dielectric layer 4 formed on the side wall of the lower electrode 3, and the dielectric layer 4 formed on the substrate 2 (FIG. 7B).

Formation of Extension Electrodes

Figure 8A:
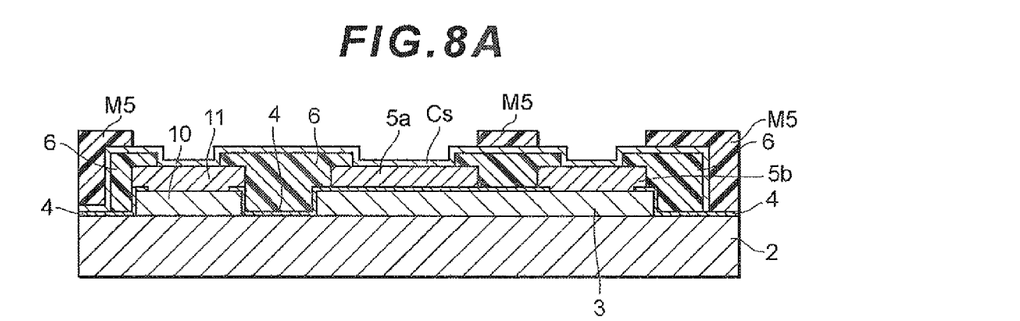
FIGS. 8A-8B are process charts showing the steps for manufacturing a capacitor 1.
Figure 8B:
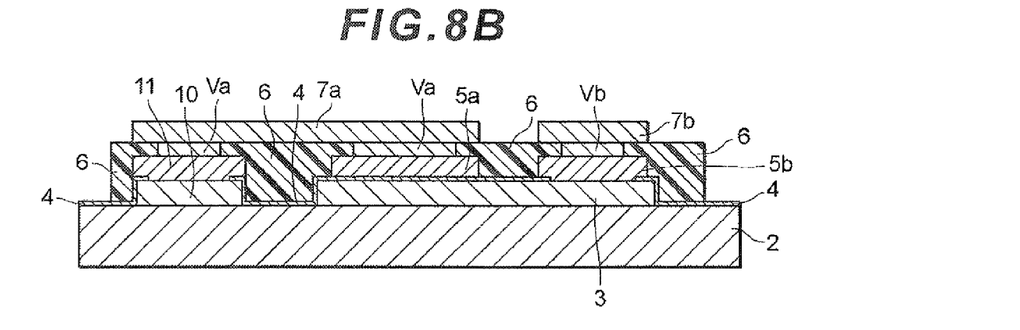

Next, conductor layers 7a and 7b used as extension electrodes are formed on the top surface of the above-obtained first passivation layer 6 as well as the top surfaces of the first upper electrode 5a, the second upper electrode 5b and the second seat 11 shown in FIG. 7, by plating or CVD, etc. More specifically, a base conductor layer Cs having a film thickness of around 0.01-1 µm is first formed on the first passivation layer 6 and the dielectric layer 4 as a seed layer by sputtering or non-electrolytic plating. After that, a resist mask M5 is arranged on the base conductor layer Cs (FIG. 8A). Subsequently, the exposed portions (not covered with the resist mask M5) of the base conductor layer Cs on the top surface of the first passivation layer 6 as well as the top surfaces of the first and second upper electrodes 5a and 5b and the second seat 11 are selectively electroplated (electrolytically plated) so that an electroplate conductor layer for the formation of the extension electrodes has been electrodeposited with a desired thickness. After that, by removing the resist mask M5 and the seed layer outside the electroplate conductor layer, the conductor layers 7a and 7b used as the extension electrodes, a via-conductor Va connecting the first extension electrode 7a and the first upper electrode 5a, another via-conductor Va connecting the first extension electrode 7a and the second seat 11, and a via-conductor Vb connecting the second extension electrode 7b and the second upper electrode 5b, are obtained (FIG. 8B). In FIG. 8B, the conductor layers 7a and 7b are given the same reference numerals as the respective extension electrodes 7a and 7b.

Formation of Second Passivation Layer

Figure 9A:
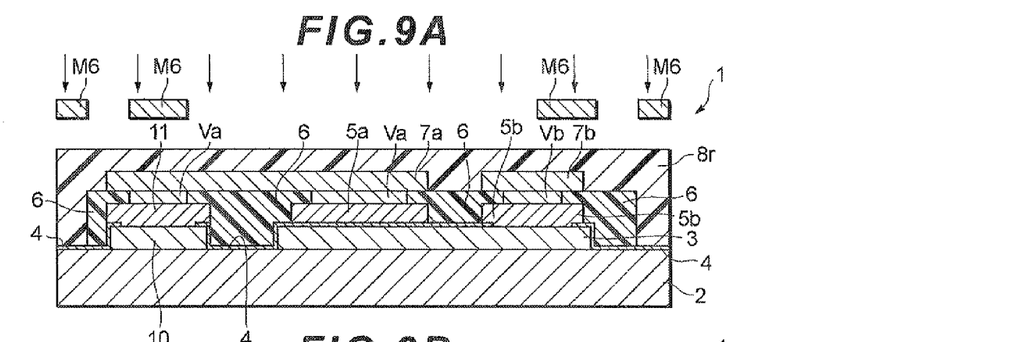
FIGS. 9A-9B are process charts showing the steps for manufacturing a capacitor 1.
Figure 9B:
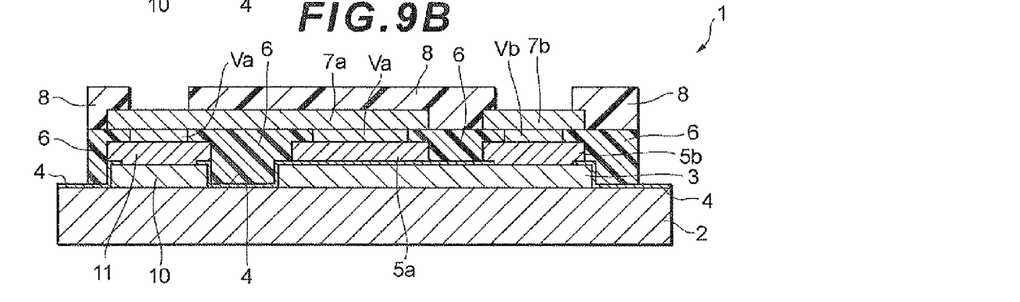

Next, a second passivation layer 8 for covering the extension electrodes 7a and 7b is formed. More specifically, for example, an uncured photo-curable resin 8r is applied to the top surface of the extension electrodes 7a and 7b, the top surface of the first passivation layer 6 and the top surface of the exposed dielectric layer 4 (FIG. 9A). After that, a metal mask M6 is placed over the portion where the second passivation layer 8 is not to be formed, and in this state, patterning is carried out by photolithography, thereby forming the second passivation layer 8 on the top surface of the extension electrodes 7a and 7b and on the top surface of the first passivation layer 6 outside the extension electrodes (FIG. 9B).

Formation of Pad Electrodes

Figure 10A:
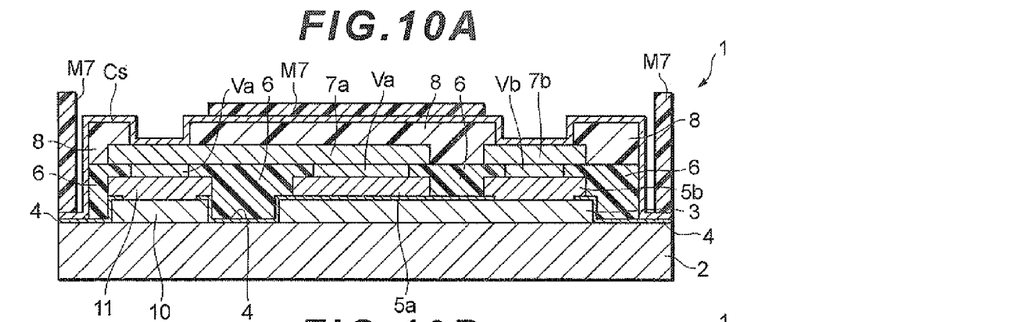
FIGS. 10A-10B are process charts showing the steps for manufacturing a capacitor 1.

Next, pad electrodes 9a and 9b are formed to cover the top surface and side wall of the second passivation layer 8, the exposed portion of the extension electrodes 7a and 7b, the side wall of the first passivation layer 6, and the top surface of the dielectric layer 4 formed outside the first passivation layer 6. More specifically, a base conductor layer Cs having a film thickness of around 0.01-1 µm is formed by sputtering or non-electrolytic plating as a seed layer on the top surface and side wall of the second passivation layer 8, the exposed portion of the extension electrodes 7a and 7b, the side wall of the first passivation layer 6, and the top surface of the dielectric layer 4 formed outside the first passivation layer 6. After that, in order to ensure a margin for alignment errors to be used when obtaining each capacitor 1 by dicing, a resist mask M7 is placed at the edge portion of the substrate 2, on the dielectric layer 4 formed outside the first passivation layer 6, and the mask is also placed at the center portion of the substrate 2 in a plan view, on the second passivation layer 8 (FIG. 10A).

Figure 10B:
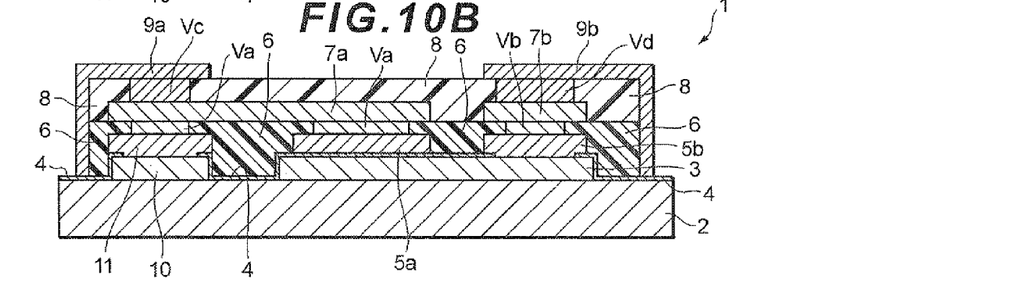

After that, the exposed portions of the base conductor layer Cs, the exposed portions being on the top surface of the extraction electrodes 7a and 7b not covered with the second passivation layer 8, the top surface and side wall of the second passivation layer 8, the side wall of the first passivation layer 6, and the top surface of the dielectric layer 4 formed outside the first passivation layer 6 and not covered with the resist mask M7, are selectively electroplated (electrolytically plated), so that an electroplate conductor layer for the formation of the pad electrodes has been electrodeposited with a desired thickness. After that, by removing the resist mask M7 and the seed layer formed outside the electroplate conductor layer, conductor layers 9a and 9b used as the pad electrodes are obtained together with a via-conductor Vc connecting the pad electrode 9a and the first extension electrode 7a and a via-conductor Vd connecting the pad electrode 9b and the second extension electrode 7b (FIG. 10B). The above conductor layers 9a and 9b used as the pad electrodes are formed so as to not only cover the top surface of the second passivation layer 8 but also cover the side walls of the first passivation layer 6 and the second passivation layer 8, and reach the top surface of the dielectric layer 4 formed on the substrate 2. In FIG. 10B, the conductor layers 9a and 9b are given the same reference numerals as the pad electrodes 9a and 9b.

After that, although not shown in the drawings, a passivation layer for assigning an identification number for the capacitor 1 is formed between the pad electrodes 9a and 9b and in the same layer as the pad electrodes 9s and 9b. The substrate 2 is thereafter cut (diced) at a specific portion between the capacitors 1. As a result, individual pieces of the capacitors 1 as shown in FIG. 1 are obtained.

In order to evaluate the adhesion strength of the capacitor 1 of this embodiment manufactured as above and having the first seat 10, the second seat 11 and the pad electrodes 9a and 9b, the inventors of the present invention measured and evaluated the adhesion strength of the capacitor 1 of this embodiment and other capacitors having different terminal electrode configurations, and found that the capacitor 1 of this embodiment can exhibit higher adhesion strength than the capacitors with different configurations.

Figure 11:
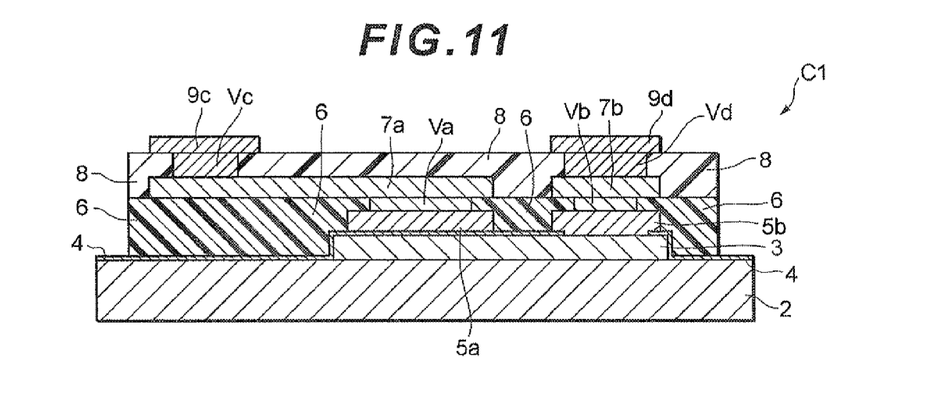
FIG. 11 is a cross sectional view of a capacitor C1 having a configuration different from that of a capacitor according to the first embodiment of the invention.
Figure 12:
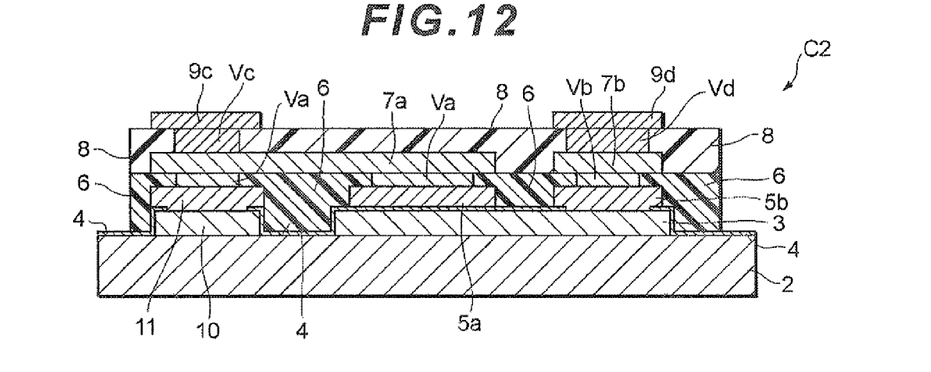
FIG. 12 is a cross sectional view of a capacitor C2 having a configuration different from that of a capacitor according to the first embodiment of the invention.
Figure 13:
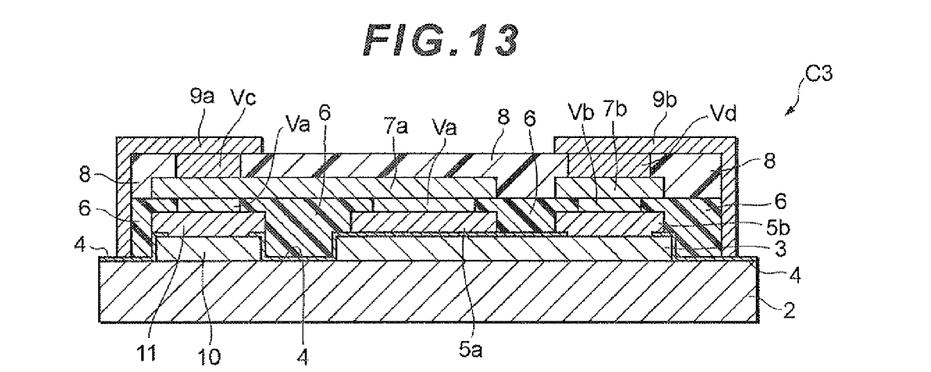
FIG. 13 is a cross sectional view of a capacitor C3 according to the first embodiment of the invention.

FIGS. 11-13 respectively show the configurations of capacitors C1-C3, which were examined in the above measurement and evaluation of adhesion strength. More specifically, the capacitor C1 shown in FIG. 11 has a configuration different from the capacitor 1 of this embodiment in that the first passivation layer 6 is applied without forming the first seat 10 and the second seat 11, and that the pad electrodes 9c and 9d are formed only on the top surface of the second passivation layer 8 and do not cover the side walls thereof. The capacitor C2 shown in FIG. 12 has a configuration where the first seat 10 and the second seat 11 are formed as in the capacitor 1 of this embodiment, but unlike the capacitor 1, the pad electrodes 9c and 9d are formed only on the top surface of the second passivation layer 8 and do not cover the side walls thereof. The capacitor C3 shown in FIG. 13 has the same configuration as that of the capacitor 1 of this embodiment formed according to the above-described manufacturing steps.

Figure 14:
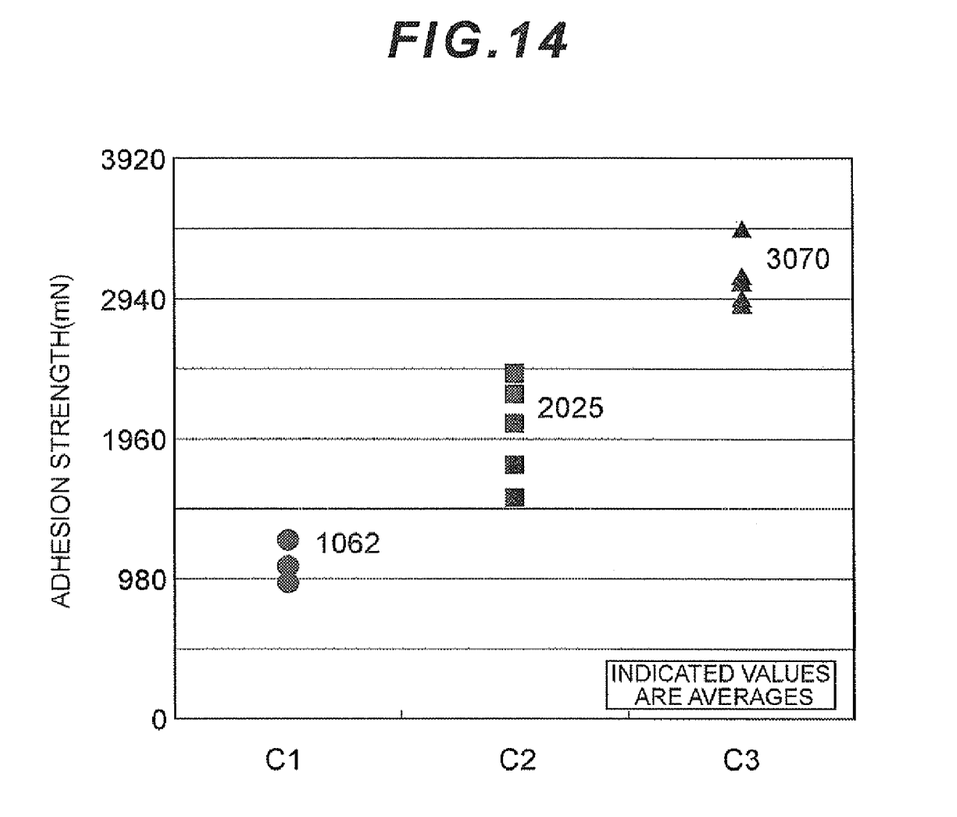
FIG. 14 is a graph showing the result of evaluation of capacitors C1-C3 in terms of adhesion strength.

FIG. 14 shows the results of the adhesion strength measurement concerning the capacitors C1-C3 having different configurations as described above. In this adhesion strength measurement, several samples were examined for each capacitor. By using a test piece, stress was applied to the side face of each of the capacitors C1-C3 mounted on an external substrate. The value of stress measured immediately before each capacitor separated from the external substrate was deemed as the adhesion strength value of that capacitor.

In FIG. 14, black circles (●) indicate the measured values of adhesion strength of the capacitor C1 samples, and the average value was 1062 (mN). Also, black squares (■) indicate the measured values of adhesion strength of the capacitor C2 samples, and the average value was 2025 (mN). Also, black triangles (▲) indicate the measured values of adhesion strength of the capacitor C3 samples, and the average value was 3070 (mN).

The above results shown in FIG. 14 demonstrate that capacitors having different configurations exhibit different values of adhesion strength. The results also demonstrate that the capacitors C2 and C3, both of which have the first seat 10 and the second seat 11 according to the invention, exhibit significantly high adhesion strength values compared to the capacitor C1 not having such seats. In other words, the results show that, by forming the first seat 10 and the second seat 11 as conductor layers, and disposing the first seat 10, second seat 11, via-conductor Va, first extension electrode 7a, via-conductor Vc and pad electrode 9a in sequence, in the form of a column of conductors, the adhesion strength of the capacitor 1 can be significantly improved.

Also, by forming the first seat 10 and the second seat 11, the same heights (levels) of the pad electrodes 9a and 9b can be ensured, and as a result, when bringing the pad electrodes 9a and 9b into contact with external inspection probes (inspection pins), contact failure between them can be prevented. Furthermore, damage of the inspection pins, which would possibly occur due to different heights of the pad electrode 9a and 9b, can be reduced. Moreover, since the seat portion composed of the first seat 10 and the second seat 11 is formed simultaneously with the formation of the capacitor 1, a simplified manufacturing process can be obtained compared to the case where the seat portion is formed at a different time in different steps.

Also, since the pad electrode 9a is disposed above the seat portion (the first seat 10 and the second seat 11) which is adjacent to the effective area of the capacitor 1 (the lower electrode 3, the first upper electrode 5a, and the dielectric layer 4 provided between them), in other words, the pad electrode 9a is not formed directly above the effective area of the capacitor 1, when heat treatment is performed for the formation of the conductor structure of the pad electrode 9a, the heat (stress) arising from that treatment does not directly transfer to the capacitor 1, and a thermal influence to the capacitor 1 can be removed or reduced. Also, since the pad electrodes 9a and 9b are not located directly above the effective area of the capacitor 1, when pressing inspection probes (inspection pins) on the pad electrodes 9a and 9b for the inspection of the capacitor 1 as described above, the mechanical pressing force can be prevented from being applied to the effective area of the capacitor 1. As stated above, the capacitor 1 can be protected from thermal and mechanical stress, and thus, the reliability of the electronic component 1 can be increased.

Furthermore, since the first extension electrode 7a is formed to be extended (projected out) from the first upper electrode 5a toward the second seat 11 so as to connect the first upper electrode 5a and the first seat 10, the first upper electrode 5a which is the element electrode can be disposed in a small area, not including the area (region) required to form the column of conductors including the first seat 10 (the area required to form the pad electrode 9a). Thus, the effective area of the capacitor 1, which is defined by the first upper electrode 5a, can be reduced as required and desired. Accordingly, compared to a capacitor configuration where the first upper electrode 5a extends to the area of the first seat 10 (and the second seat 11), the invention can easily achieve the smaller capacity capacitors which are demanded, and in this respect, the invention can increase a margin of design for the electronic circuit element structure.

Furthermore, the pad electrodes 9a and 9b are formed to cover the side walls of the first passivation layer 6 and the second passivation layer 8 and extend outward from the first passivation layer 6 and the second passivation layer 8; in other words, the pad electrodes 9a and 9b are formed on not only the top surface of the second passivation layer 8 but also the side walls of the first passivation layer 6 and the second passivation layer 8. As a result, when soldering the capacitor 1, a solder fillet is formed to extend from the side walls of the pad electrodes 9a and 9b, and thus, the area of contact between the solder and the pad electrodes 9a and 9b increases, resulting in the improved adhesion strength of the soldered capacitor 1.

Furthermore, while the dielectric layer 4 is exposed at the edge portion of the substrate 2, the dielectric layer 4 is covered with the pad electrodes 9a and 9b except the exposed portion, in other words, the pad electrodes 9a and 9b are formed to extend to the top surface of the dielectric layer 4 outside the first passivation layer 6. Since the pad electrodes 9a and 9b are formed such that the edge portion of the substrate 2 is exposed, the exposed edge portion of the substrate 2 acts as a solder stopper and provide a margin for alignment errors in dicing.

Figure 15:
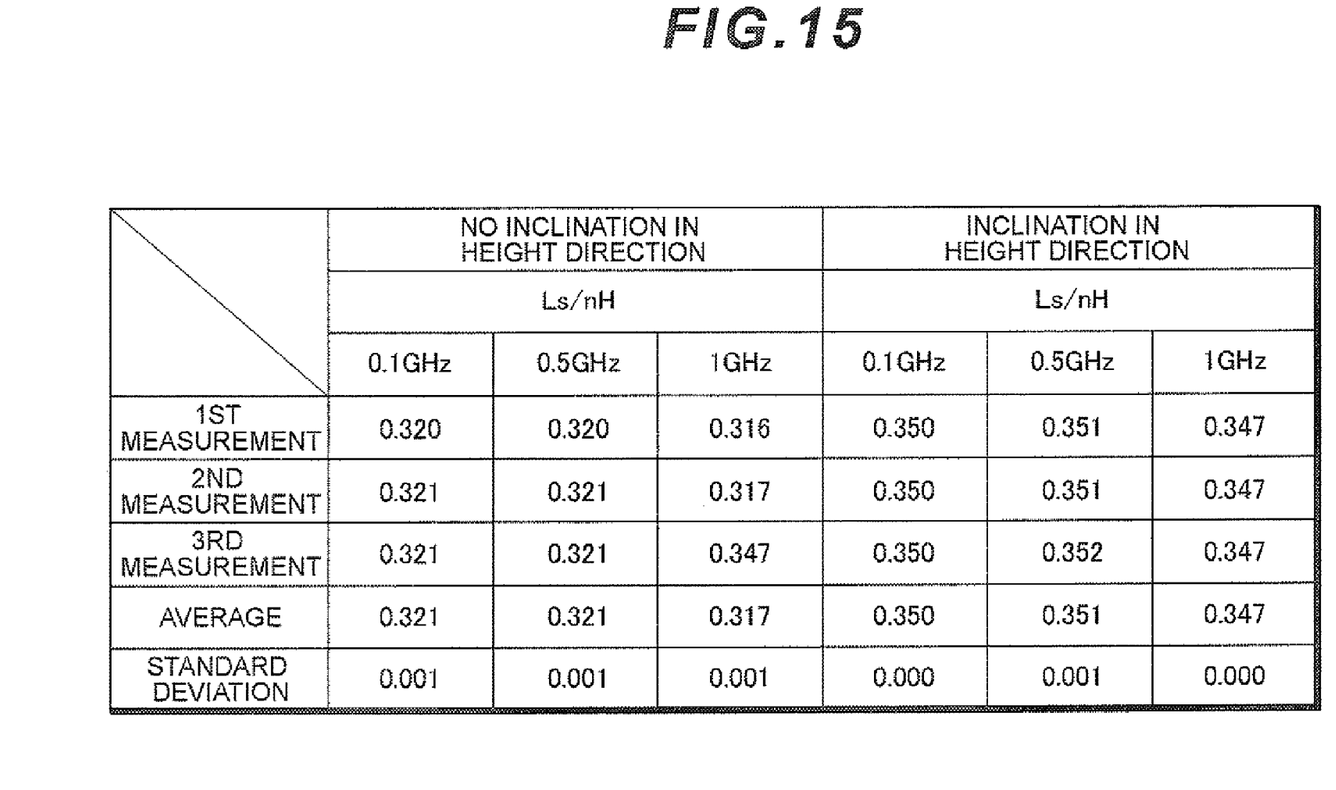
FIG. 15 is a table T1 showing, in a capacitor manufactured by a conventional method, how frequency characteristics of the capacitor vary depending on whether the capacitor has a tilt or not.

In addition, as a result of the measurement using capacitors manufactured by a conventional method, regarding how their frequency characteristics vary depending on whether they have certain tilt or not, the inventors of the present invention found that if the capacitors have certain tilt in the height (thickness) direction (or in the width direction), their ESL (equivalent series inductance) value increases and the capacitor performance deteriorates, as shown in FIG. 15. However, the capacitor 1 according to this embodiment is formed such that the longitudinal ends of the capacitor 1 are held by the pad electrodes 9a and 9b, and this allows the well-balanced adhesion of the capacitor 1, and reduces any increase in the ESL (equivalent series inductance) value of the mounted capacitor 1. As a result, high-density mounting is enabled, and furthermore, the productivity and reliability of electronic devices (products) in which the capacitor 1 is installed can be increased considerably.

Second Embodiment

Figure 16:
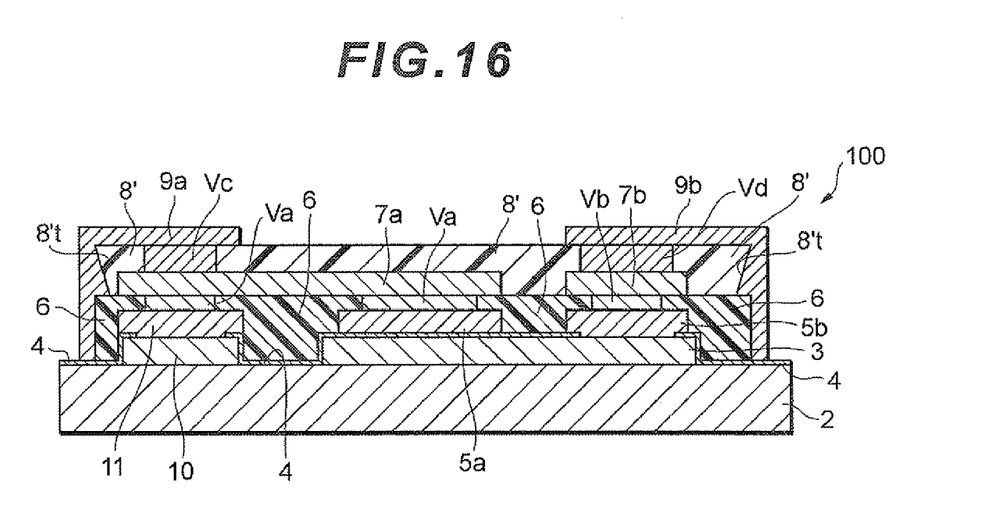
FIG. 16 is a cross sectional view illustrating the configuration of a capacitor according a second embodiment of the invention.

FIG. 16 is a cross sectional view illustrating the configuration of a capacitor 100 according a second embodiment of the invention. As shown in FIG. 16, the capacitor 100 has the same configuration as the capacitor 1 of the above-described first embodiment, except that, in a plan view, the mounting area of the second passivation layer 8' is inside the mounting area of the first passivation layer 6, and that the side wall 8t' is gradually inclined (tapered) from the top surface of the second passivation layer 8' toward the bottom (from the pad electrode 9 toward the first passivation layer 6).

When manufacturing the capacitor 100 of the above configuration, in the step shown in FIG. 9, in order to make the mounting area of the second passivation layer 8' inside the mounting area of the first passivation layer 6 in a plan view, for example, an uncured photo-curable resin is applied to the top surface of the extension electrodes 7a and 7b, the top surface of the first passivation layer 6 and the top surface of the dielectric layer 4. After that, a metal mask M6 is placed over the portion where the second passivation layer 8' is not to be formed, and specifically, the position of the metal mask M6 placed above the ends of the substrate 2 is controlled so that the mounting area of the second passivation layer 8' will be inside the mounting area of the first passivation layer 6. In this state, patterning is carried out by photolithography, thereby forming a resin layer 8' used as the second passivation layer on the top surface of the extension electrodes 7a and 7b and on the top surface of the first passivation layer 6 outside the extension electrodes 7a and 7b. Here, by adjusting the conditions of the photolithography, such as exposure and focusing conditions, the second passivation layer can be formed such that one side wall 8t' of the resin layer 8' used as the second passivation layer inclines in a tapered form from the top surface (the pad electrode 9 side) to the bottom surface (the first passivation layer 6 side) of the resin layer 8', as shown in FIG. 16.

According to the above manufacturing step, in addition to the effects of the first embodiment, separation of the first passivation layer 6 and the pad electrodes 9a and 9b, or separation of the second passivation layer 8' and the pad electrodes 9a and 9b can be prevented (or reduced), since the first passivation layer 6 and the second passivation layer 8' are formed in a step-like structure and the area of contact of the first passivation layer 6 and the second passivation layer 8' with the pad electrodes 9a and 9b which are conductor layers increases. Moreover, since the side end (side wall 8't) of the second passivation layer 8' is formed to incline in a tapered form from the pad electrodes 9a and 9b toward the first passivation layer 6, the second passivation layer 8' exhibits anchoring effects, resulting in the separation of the second passivation layer 8' and the pad electrodes 9a and 9b being further prevented (or reduced).

Also, since the pad electrodes 9a and 9b are extended (projected) out to the side wall of the substrate 2, a solder fillet is formed in a flared shape, extending outward from the side wall of the substrate, and thus, the amount of the solder increases compared to the case where the pad electrodes are not extended out to the side wall of the substrate 2. Accordingly, in the capacitor 100 of this embodiment, a self-alignment effect can be expected to be obtained, namely, even if the capacitor 100 is placed on an external substrate at a position off the desired mounting position, the capacitor 100 can move by itself to the determined position due to the surface tension of the solder melted in the soldering. Furthermore, since the area of contact between the capacitor 100 and the solder increases, the adhesion strength of the capacitor 100 in the soldering can be even further improved. Moreover, since the adhesion strength of the capacitor 100 can be improved as above, lifting of one end of the capacitor 100 or misalignment of the capacitor 100 can be reduced, in other words, the well-balanced adhesion of the capacitor 100 to the external substrate can be achieved. Such improvement of the adhesion balance may be particularly apparent if the capacitor 100 has a rectangular shape and has pad electrodes 9a and 9b at both ends in the longitudinal direction.

Although the above-described embodiments are based on the premise that the pad electrodes 9a and 9c of the capacitor 1, 100 are formed not to reach the edge portion of the substrate 2 in order to ensure a margin for alignment errors in dicing, the pad electrodes 9a and 9b may be formed to reach the edge portion of the substrate 2 so that the pad electrodes 9a and 9b and the passivation layers 6, 8, 8' can be closely adhered with increased strength. Also, the types of electronic components are not limited to capacitors, and may be passive components such as inductors, thermistors or resistance, or active components such as IC chips.

As described above, according to the electronic component of the invention and the manufacturing method thereof, it is possible to mount electronic components on an external substrate at a higher density than before, and adjust the height (level) of a terminal electrode as required and desired, thereby solving problems that would occur in the inspection of the conventional electronic components. Furthermore, it is possible to improve the electric properties and functions as well as the reliability of an electronic device (product) in which the electronic component is installed, and also improve the yield in the mounting of electronic components, thereby increasing productivity. Accordingly, the invention can be widely and effectively utilized in appliances, apparatuses, systems and devices which have an electronic circuit element or an electronic component embedded therein, in particular, those that require smaller sizes and higher performance, and can also be utilized in the production, manufacturing, etc., thereof.

Since the electronic component of the invention is configured such that a seat portion is disposed adjacent to an electronic circuit element that includes an element electrode, and such that a first terminal electrode is formed above that seat portion, the positions (heights, levels) of terminal electrodes including the first terminal electrode can be adjusted as required, and accordingly, problems that would occur in the inspection of the conventional electronic components can be solved. Also, since the area and/or amount of the solder bonded to the first terminal electrode can be reduced, the invention can allow the mounting of electronic components at a higher density than before. The invention can also improve the yield in the mounting of electronic components and thereby increase productivity.

What is claimed is:

1. An electronic component comprising:
   an electronic circuit element formed on a substrate and having an element electrode;
   a seat portion formed adjacent to the electronic circuit element;
   a passivation layer that covers the electronic circuit element and the seat portion; and
   a first terminal electrode wired out from the element electrode onto the passivation layer,
   wherein:
   the first terminal electrode is formed to extend above the seat portion,
   the element electrode includes a lower electrode formed on a side close to the substrate and an upper electrode formed above the lower electrode, and
   the seat portion has at least a first seat and a second seat which are built up such that the first seat is in the same layer as the lower electrode and the second seat is in the same layer as the upper electrode.

2. The electronic component according to claim 1, wherein the seat portion is formed of metal.

3. The electronic component according to claim 1, wherein the seat portion and the first terminal electrode are directly or indirectly metal-bonded to one another.

4. The electronic component according to claim 1, comprising a second terminal electrode connected to the lower electrode of the electronic circuit element, wherein the first terminal electrode and the second terminal electrode are disposed on opposite sides of the electronic circuit element, and the first terminal electrode is connected to the upper electrode of the electronic circuit element via an extension electrode.

* * * * *